(12) United States Patent
Kon

(10) Patent No.: US 10,903,051 B2
(45) Date of Patent: Jan. 26, 2021

(54) MATCHING METHOD AND PLASMA PROCESSING APPARATUS

(71) Applicant: Tokyo Electron Limited, Tokyo (JP)

(72) Inventor: Masato Kon, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/846,911

(22) Filed: Apr. 13, 2020

(65) Prior Publication Data

US 2020/0335306 A1    Oct. 22, 2020

(30) Foreign Application Priority Data

Apr. 22, 2019  (JP) .................................. 2019-081136

(51) Int. Cl.
*H01J 37/32* (2006.01)
*H01J 37/24* (2006.01)
*H05H 1/46* (2006.01)

(52) U.S. Cl.
CPC ...... *H01J 37/32183* (2013.01); *H01J 37/241* (2013.01); *H01J 37/32027* (2013.01); *H01J 37/3244* (2013.01); *H01J 37/32568* (2013.01); *H01J 37/32743* (2013.01); *H05H 1/46* (2013.01)

(58) Field of Classification Search
CPC .... H01J 37/241; H01J 37/32; H01J 37/32183; H01J 37/32027; H01J 37/3244; H01J 37/32468; H01J 37/32743; H05H 1/46
See application file for complete search history.

(56) References Cited

U.S. PATENT DOCUMENTS

2009/0078678 A1\* 3/2009 Kojima ............. H01J 37/32165
                                                          216/71
2020/0251345 A1\* 8/2020 Yin ..................... H01J 37/3244

FOREIGN PATENT DOCUMENTS

JP        2009-187975        8/2009

\* cited by examiner

*Primary Examiner* — Jimmy T Vu
(74) *Attorney, Agent, or Firm* — IPUSA, PLLC

(57) ABSTRACT

A method of performing impedance matching between a power supply section of a plasma processing apparatus and a chamber in the plasma processing apparatus is provided. The plasma processing apparatus includes multiple matchers, each configured to perform impedance matching between the power supply section and the chamber, and the power supply section is configured to output superimposed voltage in which radio frequency voltage is superimposed on pulsating DC voltage. According to the method, the superimposed voltage from the power supply section is applied to the chamber, through one of the provided matchers, and the matcher through which the superimposed voltage is applied to the chamber is then switched in accordance with a state of the pulsating DC voltage.

11 Claims, 6 Drawing Sheets

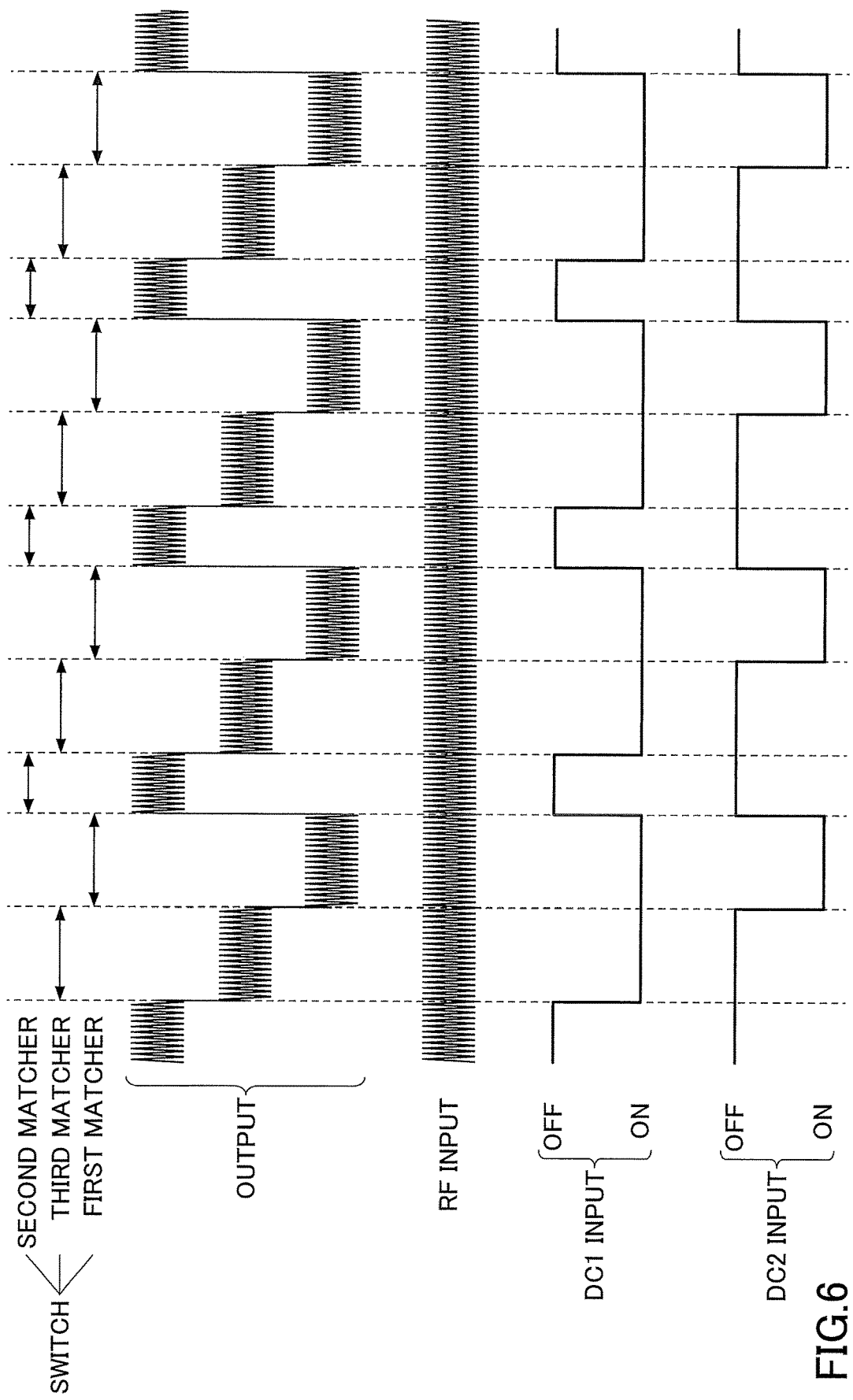

MATCHING METHOD AND PLASMA PROCESSING APPARATUS

CROSS-REFERENCE TO RELATED APPLICATIONS

This patent application is based upon and claims priority to Japanese Patent Application No. 2019-081136 filed on Apr. 22, 2019, the entire contents of which are incorporated herein by reference.

TECHNICAL FIELD

The present disclosure relates to a matching method and a plasma processing apparatus.

BACKGROUND

In a conventional plasma processing apparatus, multiple types of high frequency voltage (radio frequency voltage) each having a different frequency are superimposed on an electrode, to form a gas into a plasma and to process a substrate. Furthermore, in some conventional processing apparatuses, pulsating DC voltage is superimposed on radio frequency voltage and the superimposed voltage is applied to an electrode, to apply plasma processing to a substrate.

For example, Patent Document 1 describes a plasma processing apparatus in which high frequency voltage is applied, and DC voltage of a negative pulse is superimposed on the high frequency voltage. The plasma processing apparatus controls application of the DC voltage such that the DC voltage is applied intermittently in accordance with ON/OFF timing of the high frequency voltage.

In the plasma processing apparatus in which pulsating DC voltage is superimposed on high frequency electric power, a matching point of a matcher that achieves impedance matching between a power source and a load circuit (e.g. chamber in the plasma processing apparatus) when the pulsating DC voltage is active is different from a matching point of the matcher when the pulsating DC voltage is inactive. Thus, a reflected wave of the high frequency electric power increases in either a case in which the pulsating DC voltage is active or a case in which the pulsating DC voltage is inactive.

CITATION LIST

Patent Document

[Patent Document 1] Japanese Laid-open Patent Application Publication No. 2009-187975

SUMMARY

According to one aspect of the present disclosure, a method of performing impedance matching between a power supply section of a plasma processing apparatus and a chamber in the plasma processing apparatus is provided. The plasma processing apparatus includes a first electrode disposed on a stage, a second electrode provided in the chamber so as to face the first electrode, and a plurality of matchers each configured to perform impedance matching between the power supply section and the chamber. The power supply section is configured to output superimposed voltage in which radio frequency voltage is superimposed on pulsating DC voltage. According to the method, the superimposed voltage is applied from the power supply section to the chamber, through one of the plurality of matchers, thereby causing a gas to be formed into a plasma and causing a substrate to be processed by the plasma. The matcher through which the superimposed voltage is applied to the chamber is switched in accordance with a state of the pulsating DC voltage. When the pulsating DC voltage is switched to a first state, a matcher of the plurality of matchers is connected between the power supply section and the chamber to cause the matcher to achieve impedance matching between the power supply section and the chamber. Also, when the pulsating DC voltage is switched to a second state, another matcher of the plurality of matchers is connected between the power supply section and the chamber to cause said another matcher to achieve impedance matching between the power supply section and the chamber.

BRIEF DESCRIPTION OF THE DRAWINGS

FIG. 6 is a diagram illustrating an example of a waveform of RF voltage superimposed on pulsating DC voltage.

DETAILED DESCRIPTION OF EMBODIMENTS

Hereinafter, embodiments for carrying out the present disclosure will be described with reference to the drawings. With respect to the drawings, elements having substantially identical features are given the same reference symbols, and overlapping descriptions may be omitted.

<Plasma Processing Apparatus>

Figure 1:
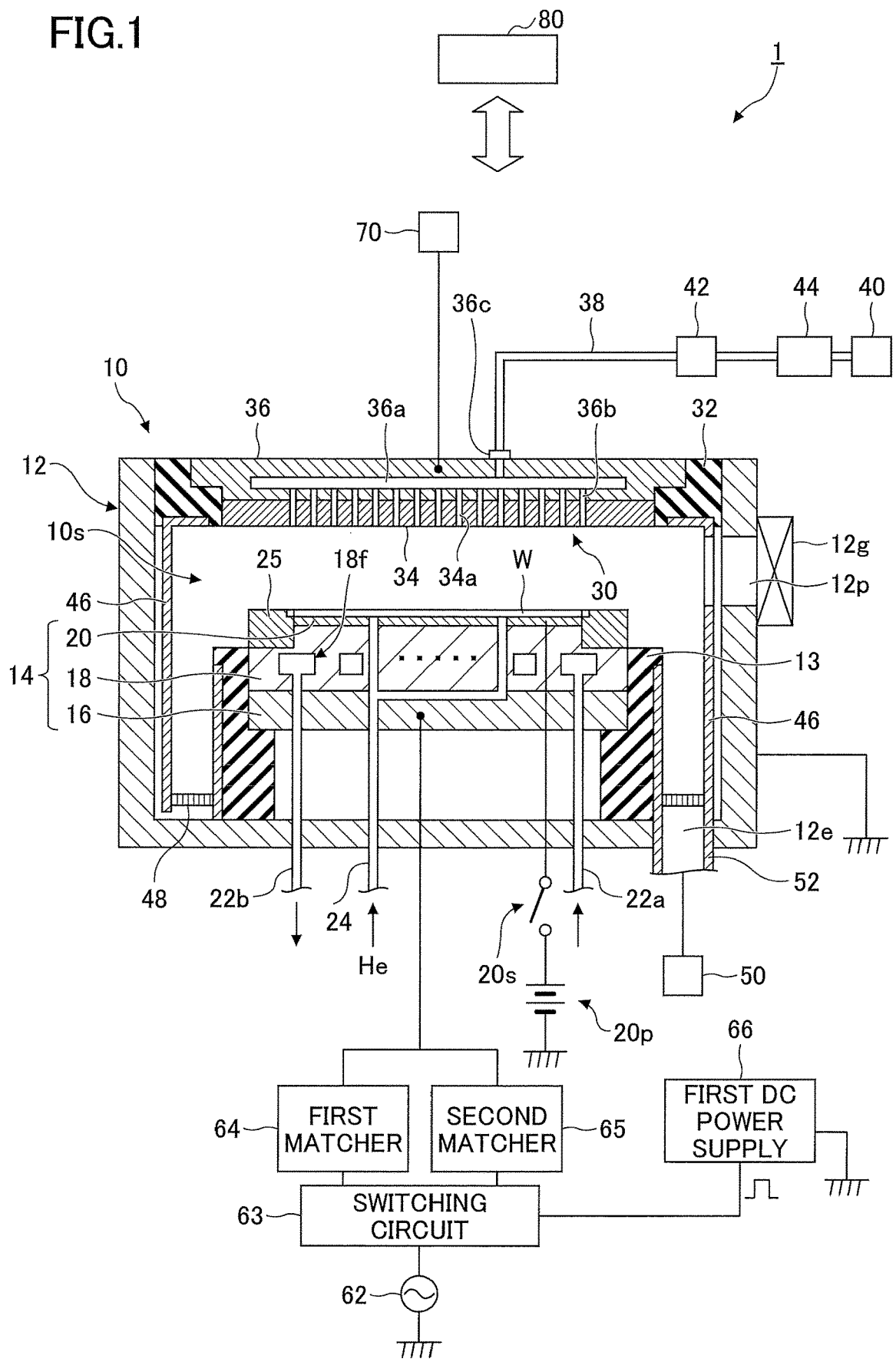
FIG. 1 is a cross-sectional diagram illustrating an example of a plasma processing apparatus according to an embodiment.

A plasma processing apparatus 1 according to an embodiment will be described with reference to FIG. 1. FIG. 1 is a cross-sectional diagram illustrating an example of the plasma processing apparatus 1 according to the present embodiment.

The plasma processing apparatus 1 includes a chamber 10. The chamber 10 provides an inner space 10s therein. The chamber 10 includes a chamber body 12. The chamber body 12 has a generally cylindrical shape. The chamber body 12 is formed of aluminum, for example. A corrosion-resistant film is provided on an inner surface of the chamber body 12. The film may be a ceramic such as aluminum oxide, yttrium oxide and the like.

A passage 12p is formed in the side wall of the chamber body 12. The substrate W is conveyed between the inner space 10s and the exterior of the chamber 10 through the passage 12p. The passage 12p is opened and closed by a gate valve 12g provided along the side wall of the chamber body 12.

A support 13 is provided on the bottom of the chamber body 12. The support 13 is formed of an insulating material. The support 13 has a generally cylindrical shape. The support 13 extends upward from the bottom of the chamber body 12 in the inner space 10s. A stage 14 is attached to an upper portion of the support 13. The stage 14 is configured to support the substrate W in the inner space 10s.

The stage 14 includes a lower electrode 18 and an electrostatic chuck 20. The stage 14 may further include an electrode plate 16. The electrode plate 16 is formed of a conductor such as aluminum, and is generally of a disc shape. The lower electrode 18 is provided on the electrode plate 16. The lower electrode 18 is formed of a conductor such as aluminum, and is generally of a disc shape. The lower electrode 18 is electrically connected to the electrode plate 16.

The electrostatic chuck 20 is provided on the lower electrode 18. The substrate W is placed on the top surface of the electrostatic chuck 20. The electrostatic chuck 20 includes a body and an electrode. The body of the electrostatic chuck 20 is generally of a disc shape, and is formed of a dielectric material. The electrode of the electrostatic chuck 20 is a film-like electrode, and is embedded in the body of the electrostatic chuck 20. The electrode of the electrostatic chuck 20 is connected to a direct-current (DC) power supply 20p via a switch 20s. When DC voltage is applied from the DC power supply 20p to the electrode of the electrostatic chuck 20, electrostatic attractive force is generated between the electrostatic chuck 20 and the substrate W. The substrate W is held on the electrostatic chuck 20 by the electrostatic attractive force.

An edge ring 25 is disposed on the periphery of the lower electrode 18 to surround the edge of the substrate W. The edge ring 25 may also be referred to as a focus ring. The edge ring 25 improves in-plane uniformity of a plasma process for the substrate W. The edge ring 25 may be formed of silicon, silicon carbide, quartz, or the like.

A flow passage 18f is formed in the lower electrode 18. A heat exchange medium (coolant or heating medium) for temperature adjustment is supplied from a chiller unit (not illustrated) disposed outside the chamber 10 through a pipe 22a. The heat exchange medium supplied to the flow passage 18f is returned to the chiller unit via a pipe 22b. In the plasma processing apparatus 1, a temperature of the substrate W placed on the electrostatic chuck 20 is regulated in accordance with heat exchange between the heat exchange medium and the lower electrode 18.

The plasma processing apparatus 1 is provided with a gas supply line 24. The gas supply line 24 supplies heat transmitting gas (e.g., He gas) from a heat transmitting gas supply mechanism to a gap between an upper surface of the electrostatic chuck 20 and a bottom surface of the substrate W.

The plasma processing apparatus 1 further includes an upper electrode 30. The upper electrode 30 is located above the stage 14. The upper electrode 30 is supported at the top of the chamber body 12 via a member 32 formed of an insulating material. The upper electrode 30 and the member 32 occlude an upper opening of the chamber body 12.

The upper electrode 30 may include a top plate 34 and a support member 36. The lower surface of the top plate 34 faces the inner space 10s. The lower surface of the top plate 34 is one of the components that defines the inner space 10s. The top plate 34 may be formed of a low resistance conductor or semiconductor with low Joule heat generation. The top plate 34 includes multiple gas discharge holes 34a that penetrate the top plate 34 in a thickness direction of the top plate 34.

The support member 36 removably supports the top plate 34. The support member 36 is formed of an electrically conductive material such as aluminum. Inside the support member 36 is a gas diffusion chamber 36a. The support member 36 includes multiple gas holes 36b extending downward from the gas diffusion chamber 36a. Each of the multiple gas holes 36b communicates with a corresponding one of the multiple gas discharge holes 34a. A gas inlet 36c is formed in the support member 36. The gas inlet 36c is connected to the gas diffusion chamber 36a. A gas supply line 38 is connected to the gas inlet 36c.

Valves 42, flow controllers 44, and gas sources 40 are connected to the gas supply line 38. In the present embodiment, a set of the gas sources 40, the valves 42, and the flow controllers 44 is referred to a gas supply section. Each of the flow controllers 44 may be a mass flow controller or a pressure-controlled flow controller. Each of the valves 42 may be an open/close valve. Each of the gas sources 40 is connected to the gas supply line 38 via a corresponding one of the valves 42 and a corresponding one of the flow controllers 44.

In the plasma processing apparatus 1, a removable shield 46 is provided along a surface of the inner side wall of the chamber body 12 and along a surface of the outer circumference of the support 13. The shield 46 prevents reaction by-products from adhering to the chamber body 12. The shield 46 may be, for example, constructed by forming a corrosion-resistant film on a surface of a base material formed of aluminum. The corrosion-resistant film may be made of a ceramic such as yttrium oxide.

A baffle plate 48 is provided between the outer circumference of the support 13 and the inner side wall of the chamber body 12. The baffle plate 48 may be, for example, constructed by forming a corrosion-resistant film (such as a film made of yttrium oxide) on the surface of a base material formed from aluminum. Multiple through-holes are formed in the baffle plate 48. An exhaust port 12e is provided below the baffle plate 48 and at the bottom of the chamber body 12. An exhaust device 50 is connected to the exhaust port 12e via an exhaust pipe 52. The exhaust device 50 includes a pressure control valve and a vacuum pump such as a turbomolecular pump.

The plasma processing apparatus 1 includes a first radio frequency power supply 62. The first radio frequency power supply 62 is a power source that generates first radio frequency electric power. The first radio frequency electric power has a frequency suitable for generating a plasma. The frequency of the first radio frequency electric power may be, for example, in a range of 12.88 MHz to 160 MHz. The plasma processing apparatus 1 further includes a first DC power supply 66. The first DC power supply 66 outputs pulsating DC voltage (which may be hereinafter denoted by "pulse DC"). The pulse DC is used to draw positive ions present in the inner space 10s into the substrate W. In the present embodiment, the first DC power supply 66 outputs two types of voltage, 0 V, or a certain magnitude (not zero) of voltage. A state in which 0 V is output from the first DC power supply 66 is referred to as "the pulse DC is inactive" or "the pulse DC is OFF". Conversely, a state in which the certain magnitude of voltage is output from the first DC power supply 66 is referred to as "the pulse DC is active" or "the pulse DC is ON". Note that, in the present embodiment, negative voltage is applied when the pulse DC is active (ON).

The first radio frequency power supply 62 and the first DC power supply 66 are connected to a switching circuit 63. The switching circuit 63 superimposes voltage output from the first radio frequency power supply 62 (may also be referred to as first radio frequency voltage) on the pulse DC, and applies the superimposed voltage to the chamber 10. Specifically, the superimposed voltage is applied to the lower electrode 18 in the chamber 10. In the present embodiment, a set of the first radio frequency power supply 62 and the first DC power supply 66 may be referred to as a "power supply section". The power supply section applies superimposed voltage to the chamber 10 (lower electrode 18) via a first matcher 64 or a second matcher 65. Each of the first matcher 64 and the second matcher 65 has circuitry for causing output impedance of the power supply section to match impedance of the chamber 10.

The switching circuit 63 receives control signals indicating that the pulse DC is active (ON) or the pulse DC is inactive (OFF), from the first DC power supply 66. Note that the switching circuit 63 does not necessarily receive the control signals from the first DC power supply 66. If the plasma processing apparatus 1 is equipped with, in addition to the first DC power supply 66, a device that supplies a control signal indicating timing when the pulse DC output from the first DC power supply 66 becomes active or inactive, the switching circuit 63 may receive the control signal from the device.

As described above, the first matcher 64 and the second matcher 65 are connected to the switching circuit 63. The switching circuit 63 includes a switching mechanism that can switch a matcher, through which the superimposed voltage is applied to the lower electrode 18, between the first matcher 64 and the second matcher 65, in accordance with a state of the pulse DC at high speed on an order of microseconds. For example, when the switching circuit 63 detects that the pulse DC is active (ON), the switching circuit 63 may switch to the first matcher 64 by using the switching mechanism. Conversely, when the switching circuit 63 detects that the pulse DC is inactive (OFF), the switching circuit 63 may switch to the second matcher 65 by using the switching mechanism. Impedance of circuit elements in each of the first matchers 64 and the second matcher 65 may be pre-configured such that a reflected wave of the radio frequency electric power applied to the lower electrode 18 is minimized, when each of the first matchers 64 and the second matcher 65 is used (connected). For example, in a case in which a variable capacitor is used in each of the first matchers 64 and the second matcher 65, capacitance of the variable capacitor may be pre-configured.

The first radio frequency power supply 62 constitutes an example of a plasma generator. In another embodiment, the pulse DC may be applied to the upper electrode 30 from a DC power supply 70. The DC power supply 70 applies voltage to the upper electrode 30 to draw positive ions present in the inner space 10s into the top plate 34.

The first radio frequency power supply 62 may be connected to the upper electrode 30 via the first matcher 64 or the second matcher 65. Also, in this case, the switching circuit 63 switches the connection between the first matcher 64 and the second matcher 65 at high speed on an order of microseconds. In this case, a control signal for switching, which is entered to the switching circuit 63, may be pulse DC of the DC power supply 70, or pulse DC of the first DC power supply 66. However, in the following description, a case in which superimposed voltage (the radio frequency and the pulse DC) is applied to the lower electrode 18 is mainly described, unless otherwise stated.

A second radio frequency power supply may be provided. The second radio frequency power supply is a power source that generates second radio frequency electric power. The second radio frequency electric power has a frequency lower than the frequency of the first radio frequency electric power. In a case in which the second radio frequency electric power is used in conjunction with the first radio frequency electric power, the second radio frequency electric power is used as radio frequency electric power for bias voltage, to draw ions into the substrate W. The frequency of the second radio frequency electric power is, for example, in a range of 80 kHz to 13.56 MHz. If the second radio frequency power supply is used with the first radio frequency power supply 62, the second radio frequency power supply is connected to the lower electrode 18 via a matcher and the electrode plate 16. The matcher includes circuitry for causing output impedance of the second radio frequency power supply to match impedance of the load (lower electrode 18).

A plasma may be generated using only one of the first radio frequency electric power and the second radio frequency electric power. That is, a single radio frequency electric power may be used for generating a plasma. In a case of generating a plasma using the second radio frequency electric power, the frequency of the second radio frequency electric power may be greater than 13.56 MHz, for example 40 MHz. In this case, the second radio frequency power supply constitutes an example of a plasma generator, and is connected to the switching circuit 63, and switching between the first matcher 64 and the second matcher 65 is performed by the switching circuit at high speed.

In the plasma processing apparatus 1, a gas is supplied from the gas supply section to the inner space 10s to generate a plasma. Also, by the first radio frequency electric power and/or the second radio frequency electric power being supplied, a radio-frequency electric field is generated between the upper electrode 30 and the lower electrode 18. The generated radio frequency electric field generates the plasma.

The plasma processing apparatus 1 may further include a controller 80. The controller 80 may be a computer including a processor, a storage device such as a memory, an input device, a display device, an input/output interface of signals, and the like. The controller 80 controls each part of the plasma processing apparatus 1. By using the input device, an operator of the plasma processing apparatus 1 can input commands to the controller 80 to manage the plasma processing apparatus 1. Also, the controller 80 can display an operating status of the plasma processing apparatus 1 on the display device. Further, a control program and recipe data are stored in the storage device. The control program is executed by the processor for executing various processes in the plasma processing apparatus 1. The processor executing the control program controls each part of the plasma processing apparatus 1, in accordance with the recipe data.

<Reflected Wave of RF>

Hereinafter, the first radio frequency electric power is referred to as RF, and the voltage of the first radio frequency electric power (first radio frequency voltage) is referred to as RF voltage. When the RF is applied from the power supply section to the chamber 10 (lower electrode 18), a part of the RF may be reflected back to the power source as a reflected wave. The reflected wave of the RF is referred to as an RF reflected wave. In a case in which the RF is superimposed on the pulse DC (the RF superimposed on the pulse DC may be referred to as "superimposed RF"), and the superimposed RF is applied to the lower electrode 18, a phenomenon occurs in which magnitude of the RF reflected wave varies in accordance with a duty cycle of the pulse DC.

In general, the RF reflected wave can be reduced by adjusting impedance (capacitance or the like) of circuit elements of a matcher to an appropriate magnitude. In the present embodiment, a state of a matcher in which impedance matching between the power supply section and the chamber 10 is achieved (that is, a state in which the RF reflected wave is minimized) is referred to as "the matcher is at a matching point". Further, magnitude of impedance (capacitance) of circuit elements of the matcher, in which impedance matching between the power supply section and the chamber 10 is achieved, may also be referred to as a "matching point". However, the matching point differs between a case in which the RF is superimposed on pulse DC of an active state and a case in which the RF is superimposed on pulse DC of an inactive state. If the matching point is not changed in both of the above-mentioned two cases, a reflected wave having a magnitude of approximately 10% to 20% of the magnitude of the superimposed RF applied to the lower electrode 18 is generated.

In contrast, if the impedance (capacitance) of the circuit elements of the matcher is to be adjusted for minimization of the RF reflected wave every time the pulse DC varies (when the pulse DC becomes active or when the pulse DC becomes inactive), the impedance of the circuit elements (such as capacitance of a variable capacitor in the matcher) needs to be changed within a microsecond.

However, because changing capacitance of the variable capacitor in the matcher requires a mechanical operation, the capacitance cannot be changed within a microsecond. The RF reflected wave generated in this manner not only results in power loss, but also may be a factor in which efficiency of plasma processing such as etching and deposition applied to a substrate W in the plasma processing apparatus 1 cannot be increased.

Figure 2A:
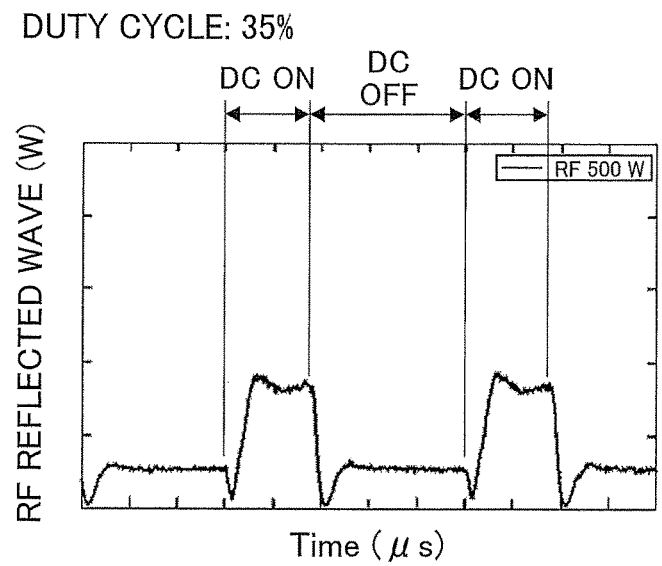
FIGS. 2A to 2C illustrate examples of RF reflected waves superimposed on pulsating DC voltage.
Figure 2B:
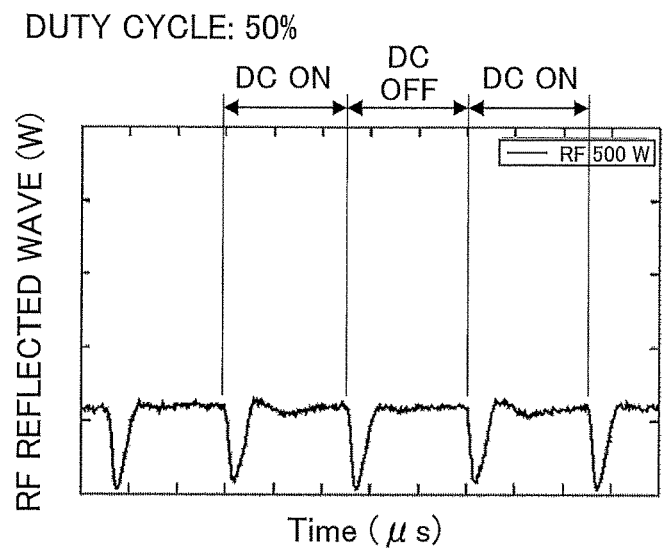
Figure 2C:
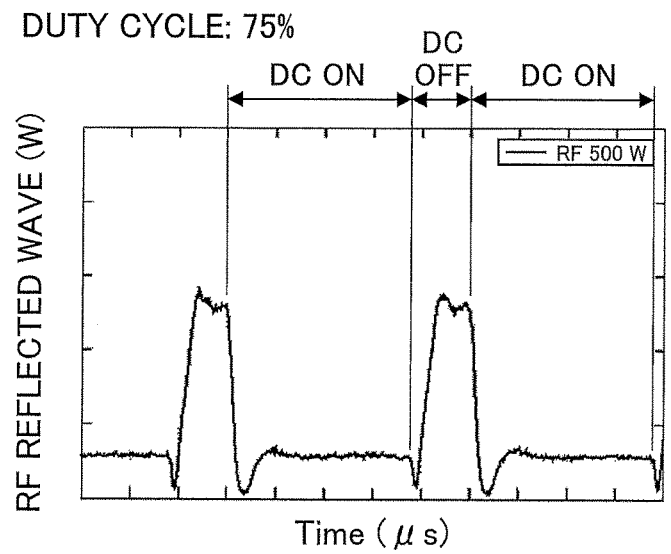

FIGS. 2A to 2C illustrate examples of the reflected waves of RF superimposed on the pulse DC. The example of FIG. 2 illustrates a case, in which 40 MHz RF was supplied at 500 W power and superimposed on DC (pulse DC) having voltage of 1000 V and pulsating at 200 kHz, and the superimposed RF is applied to the lower electrode 18. At this time, by the RF, a glow discharge occurs between the lower electrode 18 and the upper electrode 30, to produce a plasma. A part of the RF is not used to generate the plasma, and is reflected back toward the first radio frequency power supply 62 from the lower electrode 18. Waveforms of FIGS. 2A to 2C represent electric power of the RF reflected wave that has returned from the lower electrode 18. As the RF reflected wave is not used to generate the plasma, the greater the power of the RF reflected wave, the greater the power loss. In addition, the RF reflected wave may cause the first radio frequency power supply 62 to fail.

FIG. 2A illustrates the power of the RF reflected wave when a duty cycle of the pulse DC is 35%, i.e., when a ratio of a period in which the pulse DC is active (ON) to a sum of the period in which the pulse DC is active (ON) and a period in which the pulse DC is not active (OFF) is 35%. The power of the RF reflected wave when the pulse DC is ON is approximately three times the power of the RF reflected wave when the pulse DC is OFF.

FIG. 2B illustrates the power of the RF reflected wave when the duty cycle of the pulse DC is 50%, i.e., when a ratio of a period in which the pulse DC is ON to a sum of the period in which the pulse DC is ON and a period in which the pulse DC is OFF is 50%. The power of the RF reflected wave when the pulse DC is ON is the same as the power of the RF reflected wave when the pulse DC is OFF.

FIG. 2C illustrates the power of the RF reflected wave when the duty cycle of the pulse DC is 75%, i.e., when a ratio of a period in which the pulse DC is ON to a sum of the period in which the pulse DC is ON and a period in which the pulse DC is OFF is 75%. The power of the RF reflected wave when the pulse DC is OFF is approximately four times the power of the RF reflected wave when the pulse DC is ON.

That is, in a case in which the duty cycle of the pulse DC is below 50%, the reflected wave becomes greater while the pulse DC is ON, and in a case in which the duty cycle of the pulse DC is above 50%, the reflected wave becomes greater while the pulse DC is OFF.

A matcher determines a matching point so as to minimize an average of the RF reflected wave. That is, the matcher determines the matching point such that reflection is reduced while the pulse DC is ON, in a case in which a period of time when the pulse DC is ON is longer than a period of time when the pulse DC is OFF, as in the example of FIG. 2C. Meanwhile, the matcher determines the matching point such that reflection is reduced while the pulse DC is OFF, in a case in which a period of time when the pulse DC is ON is shorter than a period of time when the pulse DC is OFF, as in the example of FIG. 2A.

Here, a case in which impedance matching is performed by a single matcher in accordance with change in RF will be described. In this case, a state of the RF reflected wave when the pulse DC is ON differs from a state of the RF reflected wave when the pulse DC is OFF. Thus, because a matching point when the pulse DC is ON differs from a matching point when the pulse DC is OFF, it is necessary to change magnitude of the variable capacitor in the matcher when the pulse DC is switched from ON to OFF (or when the pulse DC is switched from OFF to ON).

In general, circuitry of the matcher used in the plasma processing apparatus 1 includes a variable capacitor configured to change its capacitance mechanically. Such a variable capacitor cannot change its capacitance at high speed. That is, the matcher cannot perform a fast matching operation. Therefore, because it is time consuming to change capacitance of the matcher due to mechanical operation, the matching point cannot be changed with sufficient timeliness.

<Matcher>

Figure 3:
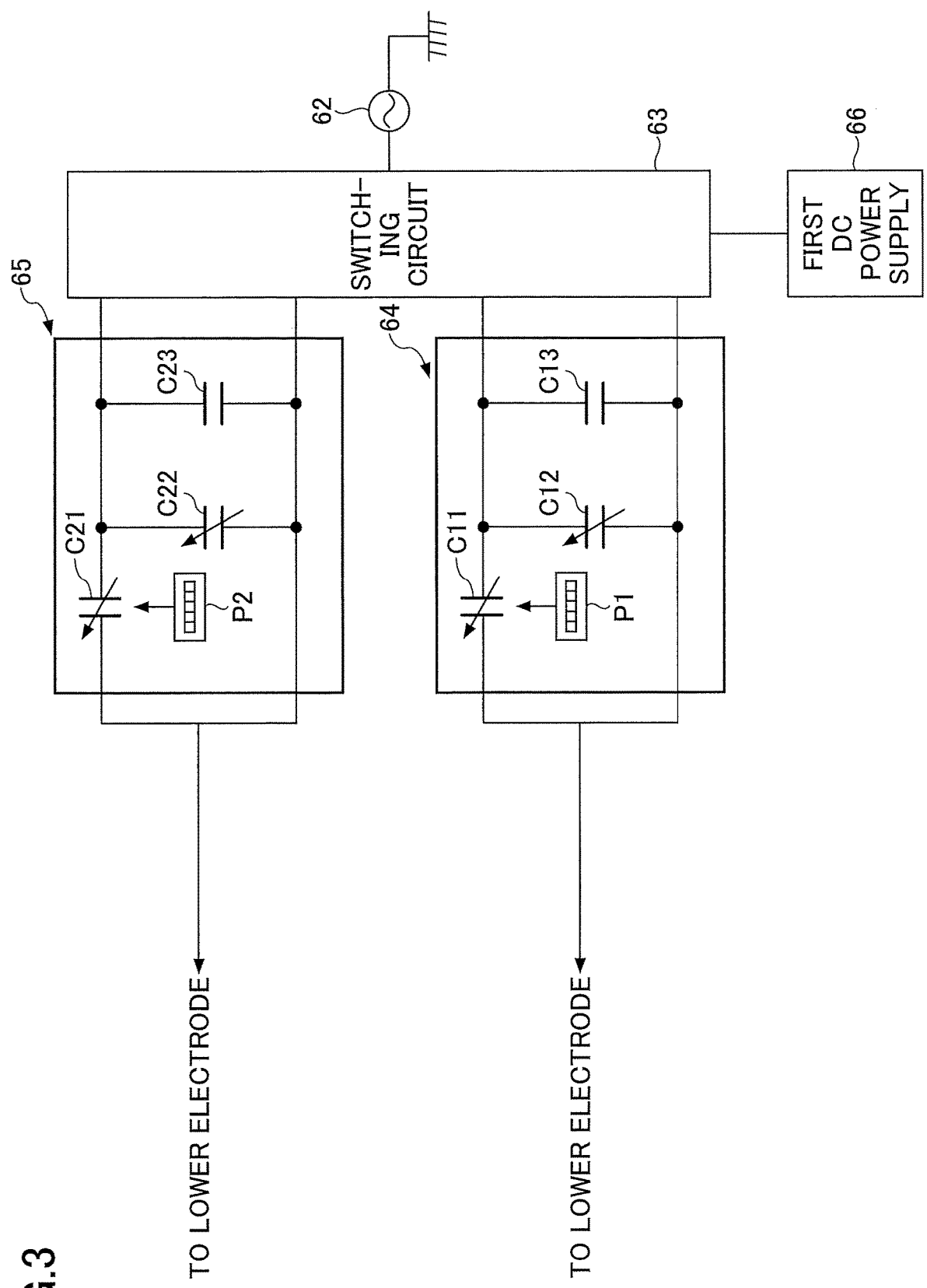
FIG. 3 is a schematic diagram illustrating a first matcher, a second matcher, and a switching circuit according to the embodiment.

Therefore, the plasma processing apparatus 1 according to the present embodiment includes two matchers, the first matcher 64 and the second matcher 65, as illustrated in FIG. 3. FIG. 3 is a conceptual diagram illustrating a first matcher, a second matcher, and a switching circuit according to the present embodiment. Specifically, the first matcher 64 includes a first variable capacitor C11 that is serially connected to the first radio frequency power supply 62. The first matcher 64 includes a second variable capacitor C12 and a fixed capacitor C13, each connected between the ground and a power line connected to the lower electrode 18. The first matcher 64 has a function of automatically adjusting impedance (capacitance) of the first variable capacitor C11 to achieve impedance matching while the radio frequency electric power is supplied from the first radio frequency power supply 62 to the lower electrode 18 (while a plasma is generated). At this time, a user can check impedance (may also be referred to as an impedance position) of the first variable capacitor C11 that automatically changes, through a matcher position unit P1.

Similarly, the second matcher 65 includes a first variable capacitor C21 that is serially connected to the first radio frequency power supply 62. The second matcher 65 includes a second variable capacitor C22 and a fixed capacitor C23 each connected between the ground and a power line connected to the lower electrode 18. The second matcher 65 has a function of automatically adjusting impedance of the first variable capacitor C21 to achieve impedance matching while the radio frequency electric power is supplied from the first radio frequency power supply 62 to the lower electrode 18 (while a plasma is generated). At this time, a user can check impedance (may also be referred to as an impedance position) of the first variable capacitor C21 that automatically changes, through a matcher position unit P2. As will be described below, as the first matcher 64 and the second matcher 65 are configured such that the respective matching points of the first matcher 64 and the second matcher 65 differ, magnitude of a capacitance component of the impedance adjusted by the first matcher 64 is different from magnitude of a capacitance component of the impedance adjusted by the second matcher 65. Note that illustration of inductors in the matchers (64 and 65) is omitted in FIG. 3.

<Impedance Matching Method>

In the matching method according to the present embodiment, in order to reduce the RF reflected wave in the plasma processing apparatus 1, a matcher to be used is switched between the first matcher 64 and the second matcher 65. Initially, each of the first variable capacitor C11 of the first matcher 64 and the first variable capacitor C21 of the second matcher 65 is adjusted such that impedance matching is expected to be achieved when the pulse DC is ON or when the pulse DC is OFF. For example, the first variable capacitor C11 of the first matcher 64 may be initially set to a magnitude at which impedance matching is expected to be achieved when the pulse DC is ON, and the first variable capacitor C21 of the second matcher 65 may be initially set to a magnitude at which impedance matching is expected to be achieved when the pulse DC is OFF. Alternatively, the first variable capacitor C11 of the first matcher 64 may be initially set to a magnitude at which impedance matching is expected to be achieved when the pulse DC is OFF, and the first variable capacitor C21 of the second matcher 65 may be initially set to a magnitude at which impedance matching is expected to be achieved when the pulse DC is ON.

The first matcher 64 and the second matcher 65 that are adjusted as described above are prepared, and the switching circuit 63 rapidly switches between the first matcher 64 and the second matcher 65 as the matcher through which the superimposed voltage is applied to the lower electrode 18. For example, the first matcher 64 may function as a matching circuit that is used when the pulse DC is ON, and the second matcher 65 may function as a matching circuit that is used when the pulse DC is OFF. In this case, when the pulse DC is ON, the switching circuit 63 switches to the first matcher 64 as a matcher through which the superimposed voltage is applied to the lower electrode 18, and switches to the second matcher 65 when the pulse DC is OFF. This allows an optimum matching point to be obtained in each state when the pulse DC is ON and OFF.

However, the first matcher 64 may function as a matching circuit that is used when the pulse DC is switched to OFF, and the second matcher 65 may function as a matching circuit that is used when the pulse DC is switched to ON. That is, in the matching method according to the present embodiment, two matchers, that is, the first matcher 64 and the second matcher 65, are used to obtain an optimum matching point, by using one of the two matchers when the pulse DC is switched to ON, and by using the other one of the two matchers when the pulse DC is switched OFF. Accordingly, during a period of RF of 40 MHz for example, impedance matching can be performed when the pulse DC is switched to ON and impedance matching can also be performed when the pulse DC is switched to OFF within a microsecond, without stopping glow discharge occurring between the upper electrode 30 and the lower electrode 18. This reduces the RF reflected wave, and therefore power loss can be reduced.

Figure 4:
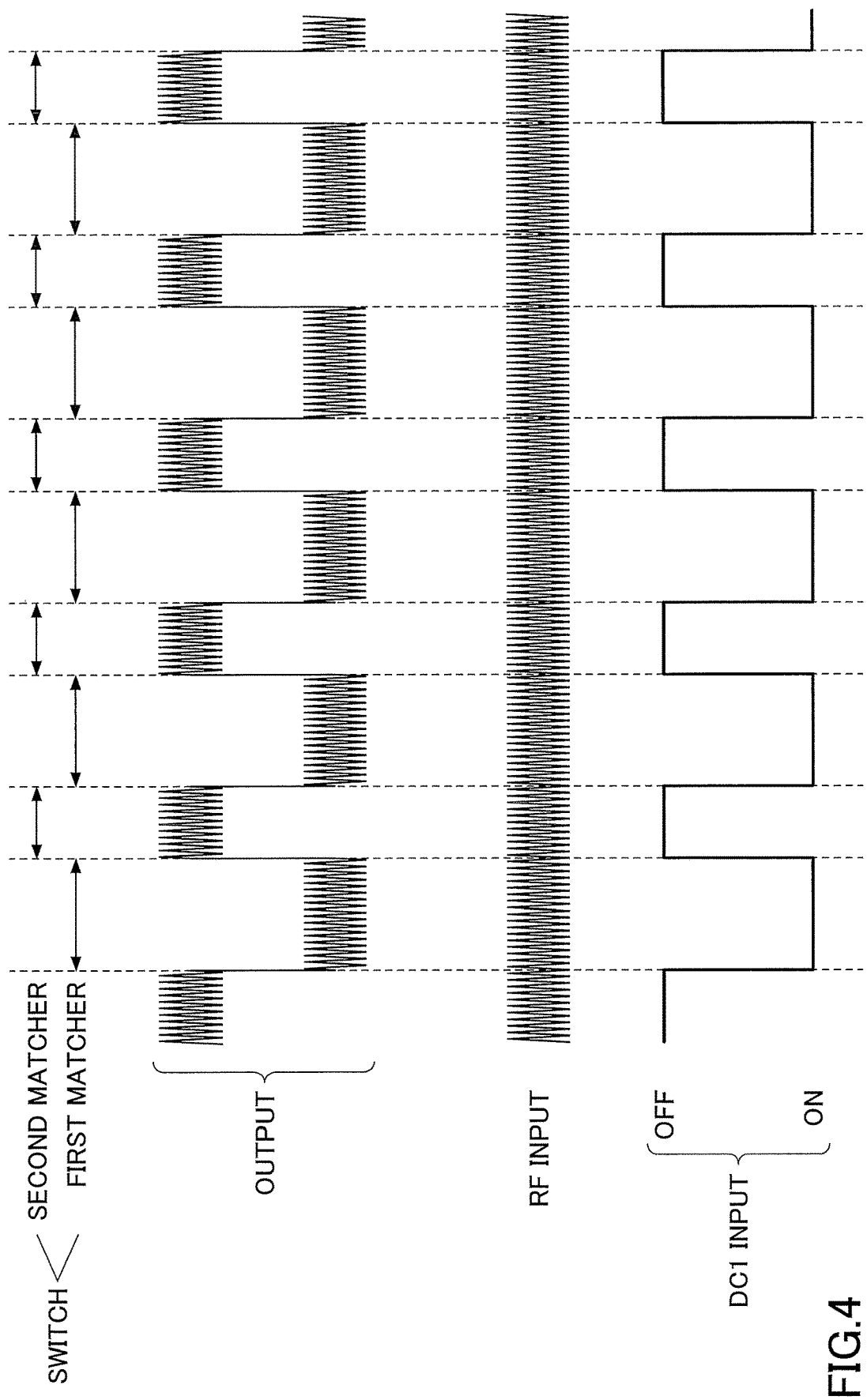
FIG. 4 illustrates an example of a waveform of RF voltage superimposed on pulsating DC voltage.

The matching method according to the present embodiment will be described in detail with reference to FIG. 4. Note that, in FIG. 4, the pulse DC output from the first DC power supply 66 is denoted by "DC1". In the present embodiment, as illustrated at the bottom of FIG. 4, pulse DC supplied from the first DC power supply 66 is input to the switching circuit 63. However, a waveform of the pulse DC (DC1) illustrated in FIG. 4 is merely an example, and is not limited to that. In the example of FIG. 4, a period of time when the pulse DC is ON is longer than a period of time when the pulse DC is OFF. That is, FIG. 4 illustrates a case in which a duty cycle of the pulse DC is above 50%. A waveform of "RF INPUT" in FIG. 4 illustrates a waveform of the RF in a case in which a frequency of the RF is 40 MHz. The pulse DC and the RF are input to the switching circuit 63 illustrated in FIG. 1, and voltage of the RF is superimposed on voltage of the pulse DC in the switching circuit 63. The switching circuit 63 outputs the superimposed voltage, as indicated by a waveform of "OUTPUT" illustrated in FIG. 4.

A state of a plasma in which the superimposed voltage of the pulse DC and the RF is applied to the lower electrode 18 varies in accordance with whether the pulse DC is ON or OFF. In a case in which the pulse DC is ON, the RF and negative DC voltage are applied to the lower electrode 18, and a state of a plasma in this case differs from that in a case in which the pulse DC is OFF (e.g. only the RF is applied to the lower electrode 18 and DC is not applied). Therefore, the switching circuit 63 switches between the first matcher 64 and the second matcher 65 as the matcher through which the superimposed voltage is applied to the lower electrode 18. While the pulse DC is ON, the switching circuit 63 causes the superimposed voltage to be applied to the lower electrode 18 through one of the first matcher 64 and the second matcher 65, and while the pulse DC is OFF, the switching circuit 63 causes the superimposed voltage to be applied to the lower electrode 18 through another one of the first matcher 64 and the second matcher 65.

Because the state of the plasma varies in accordance with whether the pulse DC is ON or OFF, impedance of the plasma varies in accordance with whether the pulse DC is ON or OFF. This means that a matching point varies. Thus, for example, capacitance of the first variable capacitor C11 of the first matcher 64 may initially be set to a magnitude at which impedance matching is expected to be achieved with respect to the plasma at a time when the pulse DC is ON in a case in which a duty cycle of the pulse DC is above 50%. Also, capacitance of the first variable capacitor C21 of the second matcher 65 may initially be set to a magnitude at which impedance matching is expected to be achieved with respect to the plasma at a time when the pulse DC is ON in a case in which a duty cycle of the pulse DC is below 50%. Hereinafter, the magnitude of capacitance of the first variable capacitor C11 in the initial state is referred to as a first matching point, and the magnitude of capacitance of the first variable capacitor C21 in the initial state is referred to as a second matching point.

In a case in which a duty cycle of the pulse DC is above 50%, the switching circuit 63 connects the first matcher 64, in which impedance matching is expected to be achieved with respect to the plasma while the pulse DC is ON, between the power supply section and the chamber 10 while the pulse DC is ON, and connects the second matcher 65 between the power supply section and the chamber 10 while the pulse DC is OFF.

The switching circuit 63 can switch between the first matcher 64 and the second matcher 65 within a microsecond in accordance with the state of the pulse DC, or in accordance with an input of a control signal indicating that the pulse DC is turned on or off. When use of the first matcher 64 is started (e.g. when the superimposed voltage is started to be applied to the lower electrode 18 through the first matcher 64), the first matcher 64 finely tunes capacitance of the first variable capacitor C11 from the first matching point as the initial state. Similarly, when use of the second matcher 65 is started, the second matcher 65 finely tunes capacitance of the first variable capacitor C21 from the second matching point as the initial state. Accordingly, in the matching method according to the present embodiment, by selecting a matcher to be used from among the matchers, each of which is optimized with respect to its impedance (capacitance) in the initial state considering differences in magnitude of the RF reflected wave between a case in which the pulse DC is ON and a case in which the pulse DC is OFF, adjustment of impedance (capacitance) of each matcher can be performed at high speed. As a result, impedance matching can be achieved both within a period of time when the pulse DC is ON and within a period of time when the pulse DC is OFF. This reduces the RF reflected wave, and therefore power loss can be reduced.

As illustrated in FIG. 2A, in a case in which a duty cycle of the pulse DC is below 50%, magnitude of the reflected wave when the pulse DC is ON is greater than magnitude of the reflected wave when the pulse DC is OFF, which is a contrary phenomenon to a case in which a duty cycle of the pulse DC is above 50%. Thus, in the case in which the duty cycle of the pulse DC is below 50%, the switching circuit 63 connects the second matcher 65, in which impedance matching is expected to be achieved with respect to the plasma while the pulse DC is ON, between the power supply section and the chamber 10 while the pulse DC is ON, and connects the first matcher 64 between the power supply section and the chamber 10 while the pulse DC is OFF. Thus, by switching between the two matchers, an adjustment amount of capacitance of each of the matchers can be reduced, when use of each of the matchers is started. As a result, impedance matching can be achieved both within a period of time when the pulse DC is ON and within a period of time when the pulse DC is OFF. This reduces the RF reflected wave, and therefore power loss can be reduced.

In a case in which the duty cycle of the pulse DC is 50%, the matcher to be used when the pulse DC is ON may be either the first matcher 64 or the second matcher 65. When the pulse DC is turned off, the switching circuit 63 may switch to the other matcher. Alternatively, the switching circuit 63 may continue to use only one matcher without switching.

As described above, in the matching method according to the present embodiment, when the pulse DC is in a first state, the radio frequency voltage superimposed on the pulse DC is applied to the lower electrode 18 via one matcher of the first matcher 64 and the second matcher 65, and impedance matching is achieved using the one matcher. Also, when the pulse DC is in a second state different from the first state, the radio frequency voltage superimposed on the pulse DC is applied to the lower electrode 18 via the other matcher of the first matcher 64 and the second matcher 65, and impedance matching is achieved using the other matcher.

In addition, in the matching method according to the present embodiment, in a case in which the duty cycle of the pulse DC is above 50%, the radio frequency voltage superimposed on the pulse DC is applied to the lower electrode 18 via the first matcher 64 while the pulse DC is in the first state, and is applied to the lower electrode 18 via the second matcher 65 while the pulse DC is in the second state. In a case in which the duty cycle of the pulse DC is below 50%, the radio frequency voltage superimposed on the pulse DC is applied to the lower electrode 18 via the second matcher 65 while the pulse DC is in the first state, and is applied to the lower electrode 18 via the first matcher 64 while the pulse DC is in the second state.

Note that the above-mentioned first and second states differ in voltage. For example, the first state may be a state in which the voltage of the pulse DC is active, and the second state may be a state in which the voltage of the pulse DC is inactive (not active).

<Variations>

Figure 5:
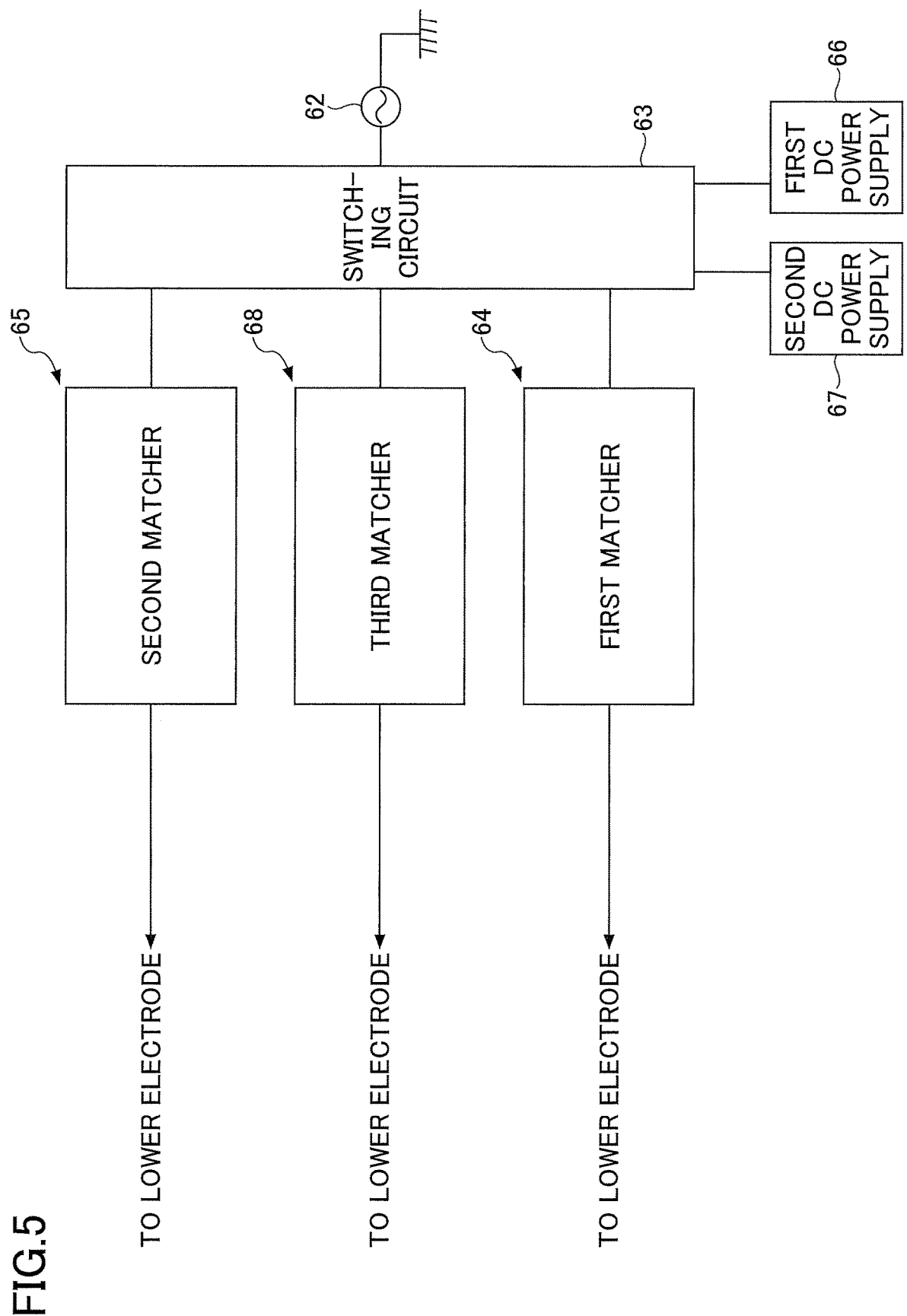
FIG. 5 is a schematic diagram illustrating the first to third matchers and the switching circuit according to a variation of the embodiment.

Next, a matching method according to a variation of the present embodiment will be described. In the matching method according to the variation of the present embodiment, a third matcher is used in addition to the first matcher 64 and the second matcher 65. The matching method according to the variation of the present embodiment will be described with reference to FIGS. 5 and 6. FIG. 5 is a schematic diagram illustrating an example of the first to third matchers and the switching circuit according to the variation of the present embodiment. FIG. 6 is a diagram illustrating an example of a waveform of RF voltage superimposed on pulsating DC voltage.

As illustrated in FIG. 5, in the present variation, RF voltage supplied from the first radio frequency power supply 62 is applied to the lower electrode 18 via the first matcher 64, the second matcher 65, or a third matcher 68. Also, in the present variation, a second DC power supply 67 is connected to the switching circuit 63, in addition to the first DC power supply 66. The RF voltage supplied from the first radio frequency power supply 62 is superimposed on a sum of voltage supplied from the first DC power supply 66 and voltage supplied from the second DC power supply 67, and the superimposed RF voltage is applied to the lower electrode 18.

In the present variation, as illustrated in FIG. 6, two types of pulsating DC voltage are input to the switching circuit 63. In the present disclosure, the first pulsating DC voltage is referred to as "pulse DC1", and the second pulsating DC voltage is referred to as "pulse DC2". The pulse DC1 is supplied from the first DC power supply 66, and the pulse DC2 is supplied from the second DC power supply 67. The waveforms of the pulse DC1 and the pulse DC2 in FIG. 6 are exemplary and not limited thereto. In the present variation, DC voltage on which the RF voltage is superimposed results from adding up the pulse DC1 and the pulse DC2. In the following description, the DC voltage that results from adding up the pulse DC1 and the pulse DC2 is referred to the "pulse DC". In the example illustrated in FIG. 6, voltage of the pulse DC, which is the sum of the pulse DC1 and the pulse DC2, has three states (in other words, the pulse DC takes three types of magnitudes of voltage). The first state corresponds to voltage of the pulse DC when both the pulse DC1 and the pulse DC2 are active. The second state corresponds to voltage of the pulse DC when both the pulse DC1 and the pulse DC2 are inactive. That is, in the second state, voltage of the pulse DC is zero. The third state corresponds to voltage of the pulse DC when the pulse DC1 is active and the pulse DC2 is inactive. Thus, voltage of the pulse DC in the third stage is between voltage of the pulse DC in the first state and voltage of the pulse DC in the second state. The switching circuit 63 outputs a waveform as represented by "outputs" in FIG. 6, in which the RF voltage is superimposed on the pulse DC.

The switching circuit 63 switches a matcher to be used to the first matcher 64 when the pulse DC is in the first state, and switches the matcher to be used to the second matcher 65 when the pulse DC is in the second state. In addition, when the pulse DC is in the third state, the matcher to be used is switched to the third matcher 68.

Capacitance in the initial state of the variable capacitor of the third matcher 68 is set to a magnitude in advance, in which impedance matching is expected to be achieved with respect to a plasma generated when the pulse DC is in the third state.

In addition, in accordance with a duty cycle of the pulse DC, one of the first matcher 64 and the second matcher 65 is used for impedance matching when the pulse DC is in the first state, and the other one of the first matcher 64 and the second matcher 65 is used for impedance matching when the pulse DC is in the second state.

By selecting a matcher to be used from among the three matchers (the first matcher 64, the second matcher 65, and the third matcher 68) in accordance with difference in the respective RF reflected waves when the pulse DC has three different power states, an adjustment amount of capacitance of each of the matchers can be reduced. As a result, impedance matching can be achieved in any of the cases in which the pulse DC is in the first state, the second state, and the third state. This reduces the RF reflected wave, and therefore power loss can be reduced.

As described above, in the matching method according to the variation of the present embodiment, when the pulse DC is switched to the third state that is different from the first and the second states, the switching circuit 63 connects the third matcher 68 between the power supply section and the chamber 10, to cause the third matcher 68 to achieve impedance matching between the power supply section and the chamber 10.

In this case, in each of the first state, the second state, and the third state of the pulse DC, the magnitude of the voltage differs. For example, when the pulse DC is in the first state, the magnitude of the voltage of the pulse DC is at a minimum value (when both the pulse DC1 and the pulse DC2 are active (ON)). When the pulse DC is in the second state (when both the pulse DC1 and the pulse DC2 are inactive (OFF)), the magnitude of the voltage of the pulse DC is a maximum value (zero). Also, when the pulse DC is in the third state, the magnitude of the voltage of the pulse DC is an intermediate value between the minimum value and the maximum value.

Note that the number of matchers is not limited to two or three. For example, if the pulse DC takes n different magnitudes of voltage, n matchers corresponding to the respective n magnitudes of voltage may be provided, and the switching circuit 63 may select a matcher to be used from among the n matchers in accordance with states (magnitudes) of the pulse DC.

As described above, according to the matching method of the present embodiment and the matching method according to the variation of the present embodiment, the reflected wave of the radio frequency electric power can be reduced to reduce power loss.

The matching method and plasma processing apparatus according to the embodiment disclosed herein are to be considered in all respects as not limiting examples. The above embodiment and variation thereof may be modified and enhanced in various forms without departing from the appended claims and spirit thereof. Matters described in the above embodiment and variation thereof may take other configurations to the extent not inconsistent, and may be combined to the extent not inconsistent.

For example, the capacitance of the fixed capacitor C13 of the first matcher 64 may differ from the capacitance of the fixed capacitor C23 of the second matcher 65 in FIG. 3. For example, if the matching point of the first variable capacitor C11 or the first variable capacitor C21 is anticipated to move out of a certain range, the capacitance of the fixed capacitor C13 or fixed capacitor C23 may be changed in advance. For example, if the matching point is anticipated to be shifted by a plasma and if a direction of the shift is known in advance, the capacitance of the fixed capacitor of at least one of the first matcher 64 and the second matcher 65, the matching point of which is anticipated to be shifted, may be changed. This allows the capacitance of the matcher to be adjust more quickly.

Incidentally, in the above-described embodiment and its variations, the first radio frequency electric power, which is the radio frequency electric power for generating a plasma, is superimposed on the pulse DC, but the present invention is not limited thereto. For example, the second radio frequency electric power having a frequency lower than the frequency of the first radio frequency electric power may be superimposed on the pulse DC. In such a case, the matching method according to the present disclosure can be used.

The plasma processing apparatus of the present disclosure is applicable to any type of plasma processing apparatus, such as an apparatus for atomic layer deposition (ALD), a capacity coupled plasma (CCP) type apparatus, an inductively coupled plasma (ICP) type apparatus, a radial line slot antenna (RLSA) type apparatus, an electron cyclotron resonance plasma (ECR) type apparatus, and a helicon wave plasma (HWP) type apparatus. The first electrode in the chamber may be a lower electrode or an upper electrode. In a case in which a first electrode is the lower electrode, a second electrode is the upper electrode. In a case in which a first electrode is the upper electrode, a second electrode is the lower electrode.

What is claimed is:

1. A method of performing impedance matching between a chamber in a plasma processing apparatus and a power supply section of the plasma processing apparatus, the plasma processing apparatus including a first electrode disposed on a stage, a second electrode provided in the chamber so as to face the first electrode, and a plurality of matchers each configured to perform impedance matching between the power supply section and the chamber, the power supply section being configured to output superimposed voltage in which radio frequency voltage is superimposed on pulsating DC voltage, the method comprising:

applying the superimposed voltage from the power supply section to the chamber, through a matcher of the plurality of matchers, thereby causing a gas to be formed into a plasma and causing a substrate to be processed by the plasma; and switching the matcher through which the superimposed voltage is applied to the chamber, in accordance with a state of the pulsating DC voltage, wherein the switching includes connecting a matcher of the plurality of matchers between the power supply section and the chamber when the pulsating DC voltage is switched to a first state, thereby causing the matcher to achieve impedance matching between the power supply section and the chamber; and connecting another matcher of the plurality of matchers between the power supply section and the chamber when the pulsating DC voltage is switched to a second state, thereby causing said another matcher to achieve impedance matching between the power supply section and the chamber.

2. The method according to claim 1, wherein
the plurality of matchers includes a first matcher and a second matcher; and
the switching further includes
in a case in which a duty cycle of the pulsating DC voltage is greater than 50%, connecting the first matcher when the pulsating DC voltage is switched to the first state, and connecting the second matcher when the pulsating DC voltage is switched to the second state; and
in a case in which a duty cycle of the pulsating DC voltage is less than 50%, connecting the second matcher when the pulsating DC voltage is switched to the first state, and connecting the first matcher when the pulsating DC voltage is switched to the second state.

3. The method according to claim 1, wherein magnitude of the pulsating DC voltage while the pulsating DC voltage is in the first state is different from magnitude of the pulsating DC voltage while the pulsating DC voltage is in the second state.

4. The method according to claim 1, wherein magnitude of the pulsating DC voltage is zero while the pulsating DC voltage is in the second state, and magnitude of the pulsating DC voltage is not zero while the pulsating DC voltage is in the first state.

5. The method according to claim 1, wherein
the plurality of matchers includes a first matcher, a second matcher, and a third matcher; and
the switching further includes
connecting the third matcher between the power supply section and the chamber when the pulsating DC voltage is switched to a third state different from the first state and the second state, thereby causing the third matcher to achieve impedance matching between the power supply section and the chamber.

6. The method according to claim 5, wherein magnitudes of the pulsating DC voltage of the first state, of the second state, and of the third state differ from each other.

7. The method according to claim 5, wherein
magnitude of the pulsating DC voltage is not zero while the pulsating DC voltage is in the first state,
magnitude of the pulsating DC voltage is zero while the pulsating DC voltage is in the second state, and
magnitude of the pulsating DC voltage while the pulsating DC voltage is in the third state is between the magnitude while the pulsating DC voltage is in the first state and the magnitude while the pulsating DC voltage is in the second state.

8. The method according to claim 2, wherein each of the first matcher and the second matcher includes a variable capacitor and a fixed capacitor; and capacitance of the fixed capacitor in the first matcher is different from capacitance of the fixed capacitor in the second matcher.

9. The method according to claim 1, wherein the pulsating DC voltage is applied to the first electrode.

10. A plasma processing apparatus comprising:
a chamber;
a stage provided in the chamber;
a first electrode disposed on the stage;
a second electrode provided in the chamber, the second electrode being disposed so as to face the first electrode;
a power supply section configured to output superimposed voltage in which radio frequency voltage is superimposed on pulsating DC voltage;
a plurality of matchers each configured to perform impedance matching between the power supply section and the chamber; and
a controller configured to perform a process including
applying the superimposed voltage from the power supply section to the chamber, through a matcher of the plurality of matchers, thereby causing a gas to be formed into a plasma and causing a substrate to be processed by the plasma; and
switching the matcher through which the superimposed voltage is applied to the chamber, in accordance with a state of the pulsating DC voltage, wherein the switching includes
connecting a matcher of the plurality of matchers between the power supply section and the chamber when the pulsating DC voltage is switched to a first state, thereby causing the matcher to achieve impedance matching between the power supply section and the chamber; and
connecting another matcher of the plurality of matchers between the power supply section and the chamber when the pulsating DC voltage is switched to a second state, thereby causing said another matcher to achieve impedance matching between the power supply section and the chamber.

11. The plasma processing apparatus according to claim 10, wherein the pulsating DC voltage is applied to the first electrode.

* * * * *